US010935722B1

(12) United States Patent
Li et al.

(10) Patent No.: US 10,935,722 B1
(45) Date of Patent: Mar. 2, 2021

(54) CMOS COMPATIBLE MATERIAL PLATFORM FOR PHOTONIC INTEGRATED CIRCUITS

(71) Applicants: Dong Li, San Ramon, CA (US); Ge Yi, San Ramon, CA (US)

(72) Inventors: Dong Li, San Ramon, CA (US); Ge Yi, San Ramon, CA (US)

(*) Notice: Subject to any disclaimer, the term of this patent is extended or adjusted under 35 U.S.C. 154(b) by 33 days.

(21) Appl. No.: 16/571,081

(22) Filed: Sep. 14, 2019

(51) Int. Cl.
*G02B 6/12* (2006.01)
*G02B 6/42* (2006.01)
*H01L 25/04* (2014.01)
*G02B 1/00* (2006.01)

(52) U.S. Cl.
CPC ......... *G02B 6/12019* (2013.01); *G02B 1/005* (2013.01); *G02B 6/12014* (2013.01); *G02B 6/4257* (2013.01); *H01L 25/041* (2013.01)

(58) Field of Classification Search
CPC ... H01L 25/041; G02B 6/1201; G02B 6/4257; G02B 6/12014
USPC .......................................................... 385/14
See application file for complete search history.

(56) References Cited

U.S. PATENT DOCUMENTS

| | | | | |
|---|---|---|---|---|
| 6,895,136 B2* | 5/2005 | Deliwala | ................ | B82Y 20/00 257/E27.112 |
| 7,116,880 B1* | 10/2006 | Liu | ........................ | G02B 6/122 385/129 |
| 2012/0149148 A1* | 6/2012 | Dallesasse | .......... | H01L 31/1876 438/107 |
| 2013/0210214 A1* | 8/2013 | Dallesasse | .......... | H01L 21/8258 438/458 |
| 2015/0177458 A1* | 6/2015 | Bowers | ................... | G02B 6/131 385/14 |
| 2015/0226918 A1* | 8/2015 | Bauters | ................ | G02B 6/1225 385/14 |
| 2016/0377806 A1* | 12/2016 | Ellis-Monaghan | ......................... | G02B 6/12002 385/14 |
| 2017/0237229 A1* | 8/2017 | Menezo | ................... | G02F 1/025 385/3 |
| 2018/0081118 A1* | 3/2018 | Klamkin | ................. | H01S 5/187 |
| 2019/0198386 A1* | 6/2019 | Ishizuka | ................. | H01L 27/12 |
| 2019/0293864 A1* | 9/2019 | Debnath | ................ | G02B 6/122 |
| 2019/0331941 A1* | 10/2019 | Coolbaugh | .............. | G02B 6/12 |

* cited by examiner

*Primary Examiner* — Michelle R Connelly

(57) ABSTRACT

A CMOS compatible heterogeneously integrated material platform for photonic integrated circuitry is invented. The material platform has SiO2 as cladding material, at least a bottom layer made of moderate refractive index (contrast) material(s), a bonded single crystal Si layer transfer from either a SOI wafer or a ion implanted single crystal Si wafer ready for ion cut split on top of the bottom layer, and some devices enabling light coupling between the devices made within these two layers. The invention provides a great material platform to offer a full set of photonic building blocks for all sorts of different applications such as photonic circuitry for optical neural network, quantum computing, telecommunication, data communication, optical switching, optical sensing, passive and/or active Si optical interposer with its size even bigger than lithography step field.

12 Claims, 19 Drawing Sheets

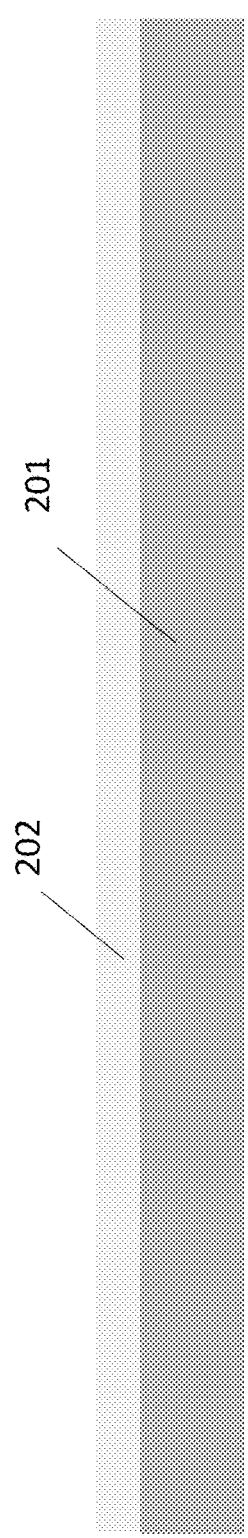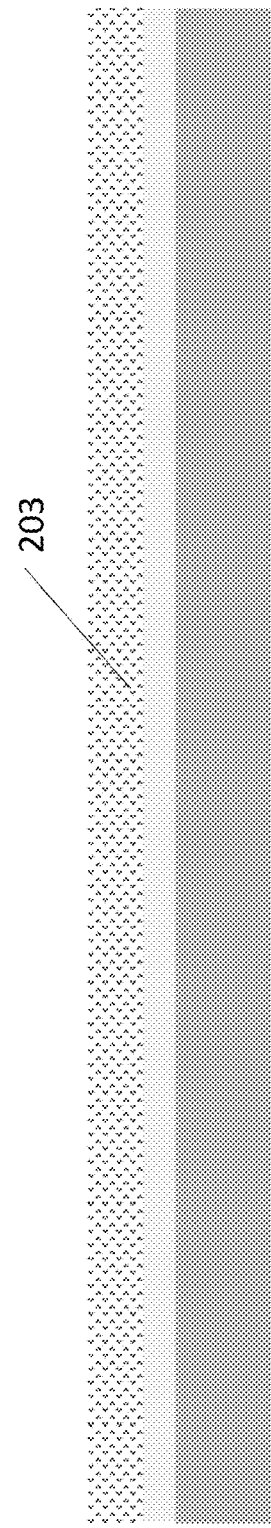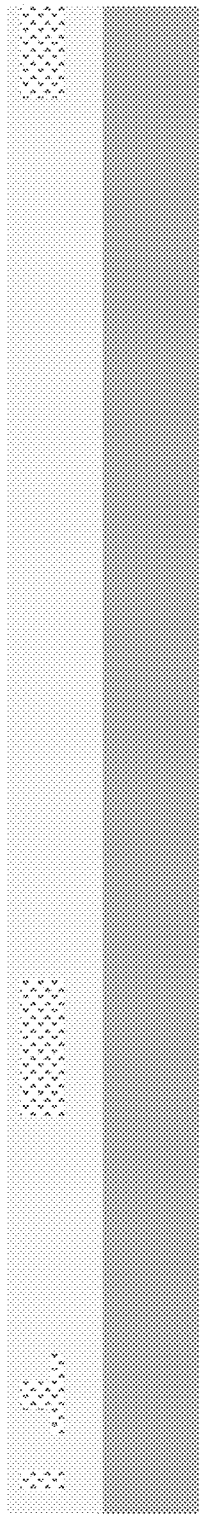
Fig.2 (a)  Fig.2 (b)  Fig.2 (c)

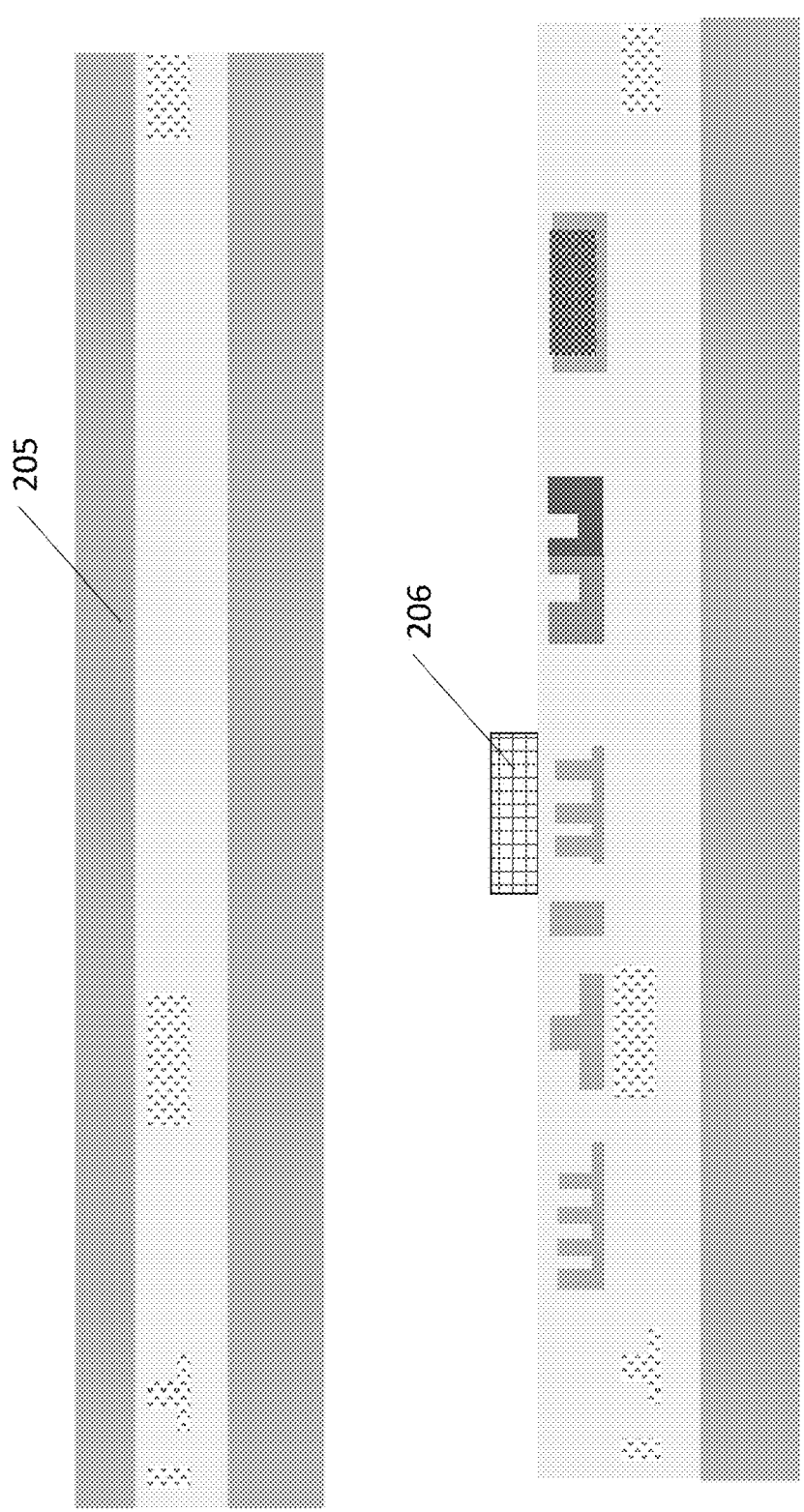

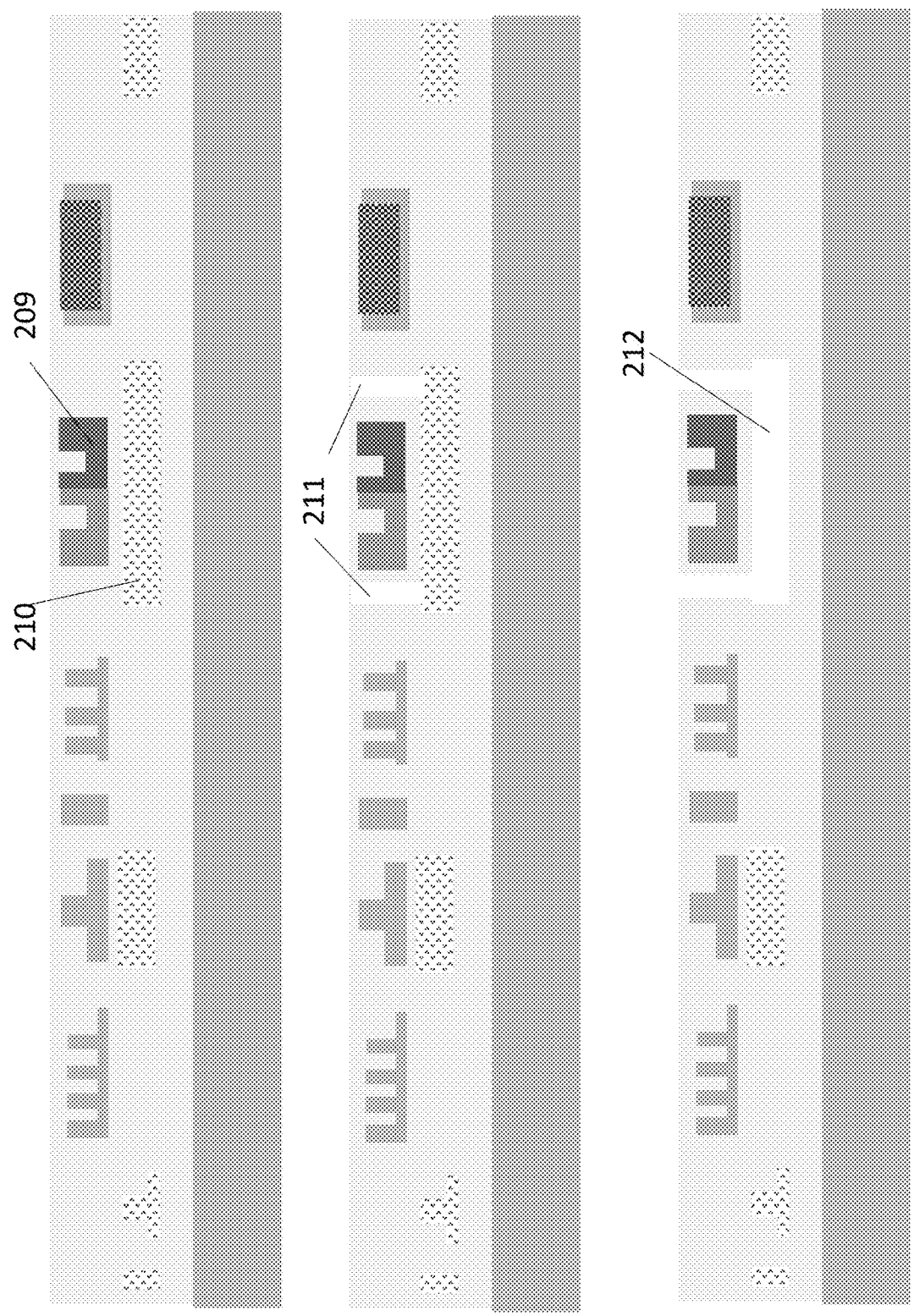

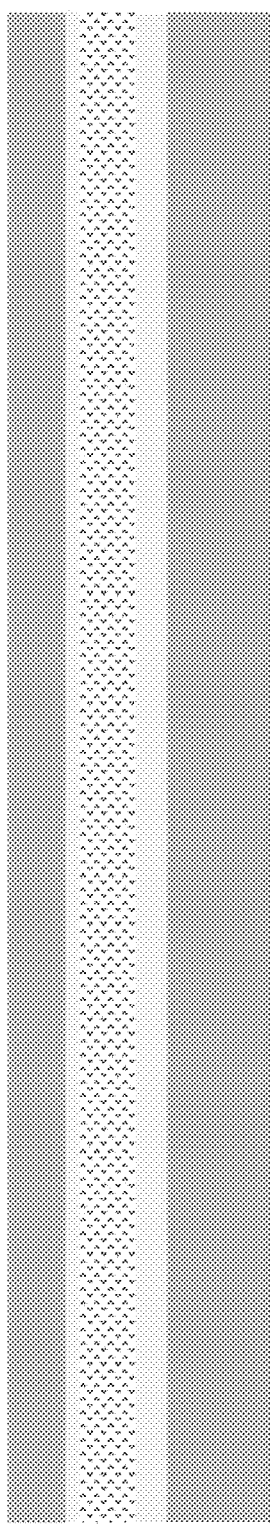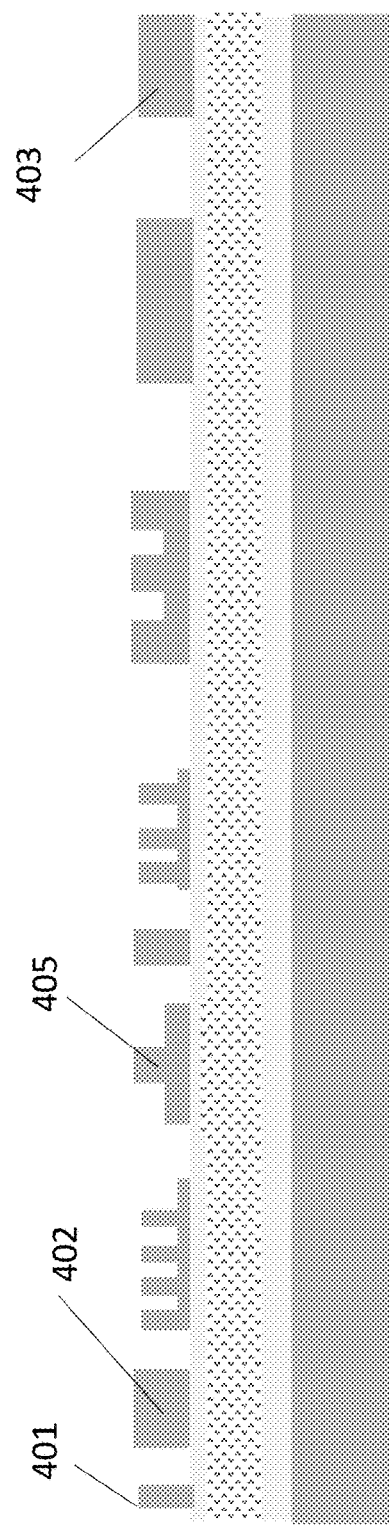
Fig.4(c)
Fig.4(d)

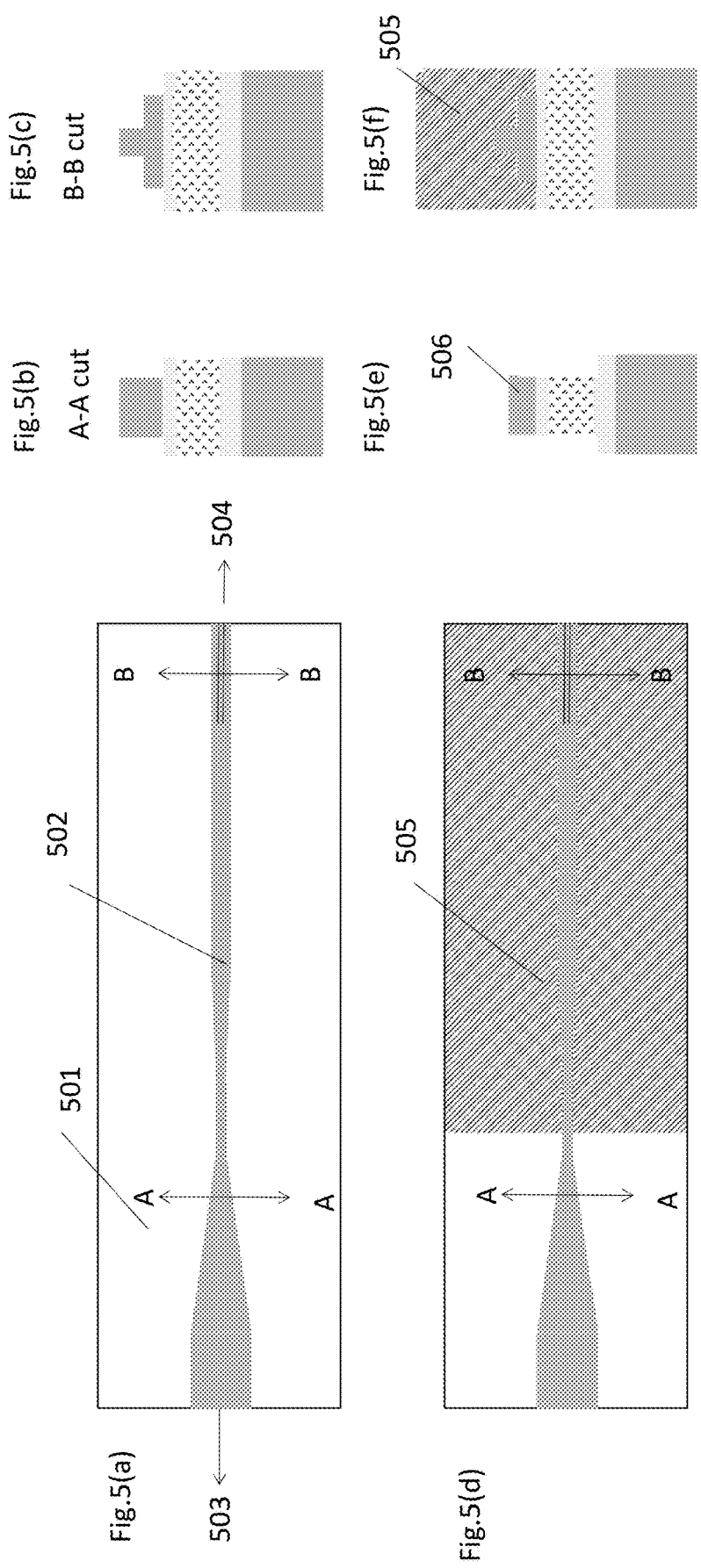

Fig.6 con't

US 10,935,722 B1

CMOS COMPATIBLE MATERIAL PLATFORM FOR PHOTONIC INTEGRATED CIRCUITS

FIELD OF INVENTION

The invention is related to material platform and process integration solutions for large scale CMOS compatible photonic integrated circuits. Particularly, using wafer-to-wafer and optical-material-stack die-to-wafer bonding enable vertically heterogeneous integration of different optical material on a single wafer substrate with medium refractive index contrast optical material close to substrate first before single crystal Si layer bonded next, then other material either over Si or over the bottom layer. There is optical coupling paths between the devices made in different material layers.

BACKGROUND ART

Photonic integrated circuits starting from communication applications has been attracted more and more attention and expand its applications in the areas of photonic artificial neural network chips for A algorithm processing/calculation; photonic chips for quantum computation; photonic chips for data processing for RF/microwave; large scale optical switch; large size active or passive optical interposer for photonic and electronic mixed (or hybrid) neural network chip or quantum computing chip; highly integrated optical sensor with multiple optical sensors targeted for different sensing functions.

In view of the above mentioned new chips with the applications in new areas, there is a trend to make the size of the photonic chips larger due to many technical reasons. For example, larger photonic chips can have more neurons and synapses, which can handle much more complicated calculations while large optical interposer to allow more electronic chips on it to be connected optically.

There are many material platforms for photonic chips, such as II-V semiconductor based (eg. InP-based); Silicon over insulator (SOI) based; diamond on insulator based; LiNbO3 based platforms. All these material platforms have developed many optical building blocks (or devices) on its own and each platform has it own advantages and disadvantage. Unfortunately, none of platforms have a comprehensive set of needed building blocks with the best performance, energy efficiency, and cost to offer to design engineers a sweet solution to meet the needs for circuit designs such as full optical neural network.

Among above mentioned platforms, the CMOS compatible ones, particularly SOI platform, has the most potentials due to the fact that they use CMOS compatible process, which offers well developed fabrication process technologies, robust reliability, low cost volume manufacture.

SOI platform is, by far, the most well developed CMOS compatible material platform. Even the III-V light source has been successfully integrated in this platform at the CMOS front end of line (FEOL) by Intel in volume production, let alone passive optical components, such as splitters, filters, (de)multiplexers (based on Mach-Zahnder interferometer (MZI)), polarization handling components, interferometers, resonators, edge or grating coupling structures to optical fibers; and also active optical components, such as high speed modulator (MZI or ring resonator based), high speed photodiode based on Ge epi-growth on Si, slow speed electrically driven micro-heaters etc.

However, SOI platform also has its own shortcomings. Firstly, Si is a indirect bandgap materials, therefore it is not easy to generate needed light source in Silicon; Secondly, due to the large refractive index contrast between Si (~3.5) and SiO2 (~1.5), the optical loss and phase of the lightwave is very sensitive to any fabrication error during wafer processes. As such, it is very hard to develop complicated passive (de)multiplexers such as arrayed waveguide grating (AWG), or planar concave grating (PCG); Thirdly, due to Si waveguide for single optical mode has width below one microns meter, to extend the optical circuit larger than the lithography step field size the stitch error between the step fields can generate some overlay errors, which generates unintended bounced wave to disturb the coherence and optical phase, which is extremely important for coherent optic chips like those used in photonic artificial neural networks and quantum computing; Fourthly, silicon have low absorption losses in the wavelength range from 1.1 μm (band edge of silicon) to about 3.7 μm (onset of mid-IR absorption of silica). For applications requiring shorter wavelengths (e.g. data communication at 850 nm, sensors operating in the therapeutic window etc.) silicon waveguide is not an option; Fifthly, silicon has two photo absorption (TPA) related to Kerr effects, therefore, it has power limitation; Sixthly, the large refractive index contrast also make the mode expansion is no that easy, alignment and coupling efficiency is not as good as the medium refractive contrast system such as silcon nitride (core)/silicon oxide (cladding) system.

Optical core material whose refractive index below 3.0 provide a moderate (or medium) refractive index contrast against silicon oxide with its refractive index (n) of 1.5 while comparing high refractive index SOI system. The moderate refractive index (contrast) material (defined here as its refractive index n<3.0) core materials gives these core/cladding systems (such as Si3N4(n~2.0)/SiO2; SiON (n~1.8)/SiO2; AlN(n~2.14)/SiO2; diamond(n~2.4)/SiO2; LiNbO3 (n~2.16)/SiO2; SiC(n~2.6)/SiO2; Ta2O5 (n~2.1)/SiO2; TiO2(n~2.5)/SiO2; Si3N4/SiO2/Si3N4(composite core)/SiO2 cladding; As2S3(n~2.5)/SiO2; high index doped SiO2 hydex(n~upto 1.9)/SiO2; and composite core using the combination of the above mentioned core materials/SiO2 cladding), great manufacturability, generally lower optical loss together with some unique linear or nonlinear functionality, such as fluorescence light generation capability like those color centers in the diamond based systems.

It has been a long effort to try to fully integrated the moderate refractive contrast system into existing SOI platform. One typical example is the effort to integrated silicon nitride, which has much less temperature sensitive (much lower thermo-optic co efficiency), lower nonlinear effects, much high power limitation, more tolerance to fabrication error (ie. waveguide length/width, gaps between the light paths) and edge roughness, in the existing SOI platform for passive (de)multiplexers. In the all cases, the silcon nitride is deposited above the SOI. In other words, the SOI wafer is used as substrate, after optical circuit is created in SOI, the SiN, not in stoichiometry though, is deposited either by PECVD or PVD on top of SOI circuit (hereby, we name it as SOI-first-approach). This integration approach has a few major disadvantages: 1) due to the SOI circuit particularly the implantation already in place as well as Ge epi-growth over Si for photodiode (Ge PD), the deposition temperature for addon new materials such as SiN has some tight limit to avoid implanted ions' diffusion or existing Ge PDs damage. Therefore, stoichiometric Si3N4 can not be obtained; 2) potential plasma radiation damage of existing during addon material deposition process; 3) the addon material changes the process and integration scheme of electric connection processes for Ge photodiode (for PECVD SiN) or existing active devices in the SOI layer. All these bring some hard technology and process limitations, for example, the SiN integrated in such a way can not be used to build passive (de)multiplexers with performance matching those build in stoichiometric Si3N4 deposited by Low Pressure Chemical Vapour Deposition (LPCVD) at high temperature (>700 C) followed by high-than-1000 C annealing for removing N—H and Si—H bonds, which has high optical absorption around 1520 nm. Apart from SiN, other CMOS compatible material systems, such as CVD/PECVD diamond, which is very important for quantum computing also need high temperature plasma processes. As such, SOI-first-approach can not offer a good material properties for diamond based optical circuit and its particular functionality.

Successfully integrated high quality moderate refractive (contrast) material with Si nano waveguide based photonic circuits similar to what has been achieved in SOI platform can provide huge advantages in various existing key technology areas and also open a lot of possibilities for Si photonics technology. We can easily name a few here. For example, the Si3N4 integration providing much large power limitation makes its a great opportunity for artificial neural network linear section, which provides necessary power needed for subsequent nonlinear portion. Si3N4 integration also provide passive (de)multiplexers such as arrayed waveguide grating (AWG), or planar concave grating (PCG), which is extremely useful for telecommunication as well as artificial photonic neural network for artificial intelligence (AI). The integrated diamond material and photonics circuit before Si nanowaveguide similar to SOI platform can provide a full set of build blocks for photonics based quantum computer. Integrated diamond or Si3N4 materials, which is less sensitive to fabrication error as well as stitch error cross lithography step fields, can extend photonic circuitry larger than the existing size of lithography step field. This makes the active or passive photonic interpose larger than lithography step size becomes possible, which will be very useful to have more electronic control chips on tops for much more complicated photonic switches for data center, photonic and electric hybrid neural network and quantum computer, and high performance computer (HPC), even to realize the concept of HPC on a chip with optical connection to the external systems, which will dramatically reduce the size of super computer.

SUMMARY OF THE INVENTION

In this invention, we proposed a heterogeneously integrated material platform, compatible to CMOS fabrication techniques, to overcome the above mentioned SOI shortcomings so that we could offer a full set the building blocks with best performance from individual material platforms.

The concept of the invention is to deposit, along with post deposition annealing if needed, the moderate refractive index (contrast) material first with the best quality due to lack of the process limitation on top of a layer or thickness-determined SiO2 layer. The photonic circuit can be made in this layer of moderate refractive index contrast material including those links between the lithography step field and the structure for fiber coupling. Post the photonic circuitry patterning, the wafer will be backfilled with SiO2 and CMP-ed (chemical mechanical polishing) with the SiO2 thickness and surface smoothness control ready for the incoming Si layer bonding. Then a thin single crystal silicon layer is bonded on top via wafer-to-wafer bonding either from a Si wafer post ion implantation for the smart cut or directly from a vendor-supplied SOI wafer as those used for today SOI platform with subsequently remove the substrate and buried oxide (BOX) layer.

Evanescence coupling feature, with mode matching structures in both layers, is used to optically couple the device in the moderate refractive index (contrast) material with the those within bonded Si layer with minimal optical loss.

After the Si layer is bonded, the inter-layer oxide, along with the silicon oxide below the layer of moderate refractive index (contrast) material, effectively acts as a "BOX" layer, similar to those in the standard SOI wafer. Moreover, if needed, extra materials such as nonlinear LiNbO3, AlN, SiC material layer can be bonded on top of the bonded single crystalline Si layer via low temperature collective die-to-wafer bonding. In same cases, if need, the bonded Si layer can be removed partially on some designated areas, so that the specified materials such as those mentioned above can be bonded and optical coupled with the photonic circuitry in the layer of moderate refractive index (contrast) material.

Since, only the whole layer of the single crystal Si layer or material chips are bonded on top of the moderate refractive index (contrast) material layer/photonic circuitry, the fabrication of the optical devices can be done with precise lithographic alignment using the lithography alignment marker built in the layer below. As such, there is little concerns for the optical alignment accuracy between different photonic circuitry within different layers.

With such as comprehensive heterogeneously integrated photonic material platform system, multiple materials with their own merits can be used to target for the best performance and lowest optical loss, as well as special functionality, which could be unique for a particular material. By doing so, we could build very complicated photo system to meet the challenges for photonic artificial neural network, quantum computer, large scale optical switch, larger than lithography step field passive and active photonic interposer for various applications.

BRIEF DESCRIPTION OF THE DRAWINGS

FIG. 4(a)-(l) an embodiment of a step-by-step process flow to generate photonic circuits in both single crystalline Si layer and the moderate refractive index material layer without patterning the moderate refractive index material layer before the single crystal Si layer bonded on.

FIG. 5(a) shows the projection view of the optical coupling structures between two layers for process flow shown in FIG. 4(d) during the pattern transfer from the top bonded single crystal Si layer to the bottom layer; FIG. 5(b)-(c) shows the cross section view along the A-A and B-B cuts respectively on FIG. 5(a); FIG. 5(d) shows the projection view of the optical coupling structures between two layers for process flow shown in FIG. 4(f); FIG. 5(e)-(f) shows the cross section view along the A-A and B-B cuts respectively on FIG. 5(b).

DETAILED DESCRIPTION

The following numerous specific detail descriptions are set forth to provide a thorough understanding of various embodiments of the present disclosure. It will be apparent to one skilled in the art, however, these specific details need not be employed to practice various embodiments of the present disclosure. In other instances, well known components or methods have not been described.

Figure 1A:
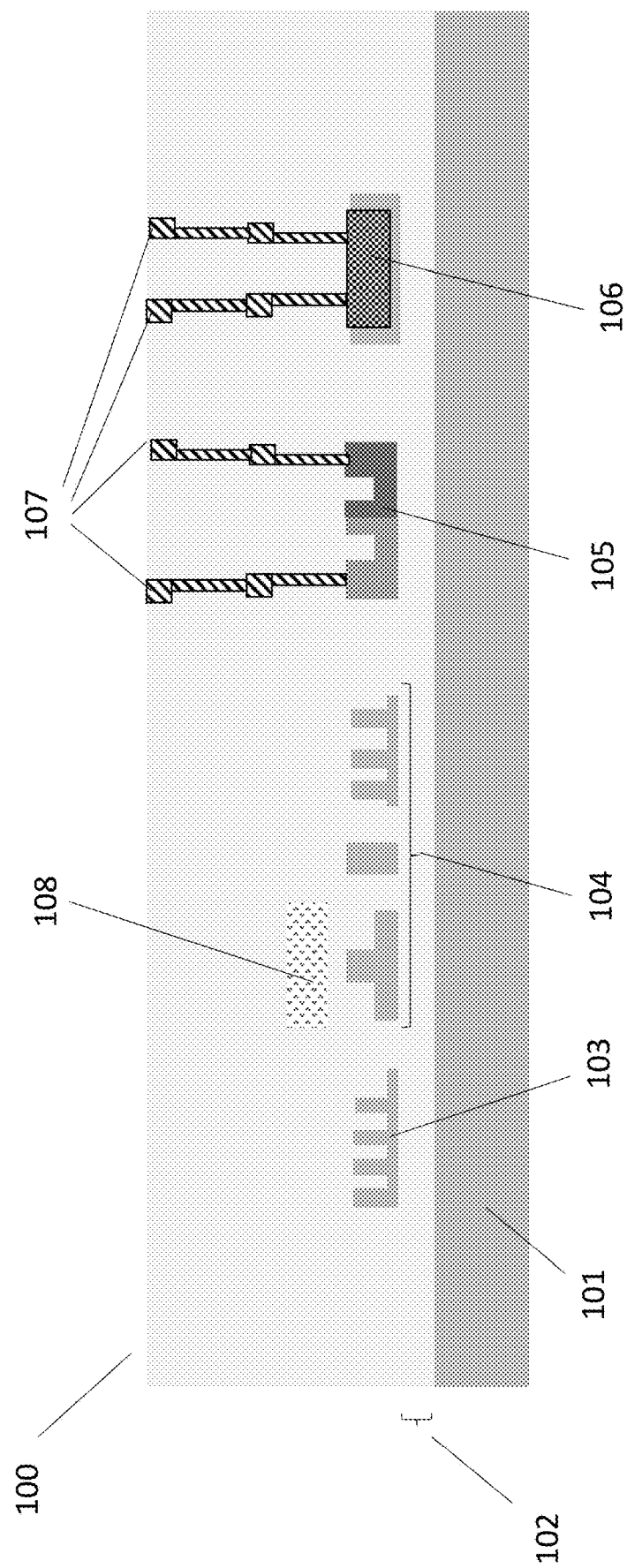
FIG. 1(a) an embodiment of existing SOI platform with SiN integrated.

FIG. 1(a) shows an embodiment of the existing silicon on insulator (SOI) platform 100 with SiN integrated on top of the patterned SOI layer. In details, the incoming SOI wafer has Si substrate 101 with buried oxide (BOX) layer 102. In the SOI layer, various photonic building blocks (devices), such as grating 103, different waveguide structures for the light routing, electrical to optical modulator 105, and Ge photodiode (Ge PD) 106. The active devices such as modulator 105 and Ge PD 106 is connected to vertical electrical connection paths 107. On top of the SOI layer, there is a layer of non stoichiometric silicon nitride (SiN) deposited by plasma enhanced chemical vapor deposition (PECVD) or physical vapor deposition (PVD). In the SiN layer, extra optical building blocks (or device) can be fabricated.

Figure 1B:
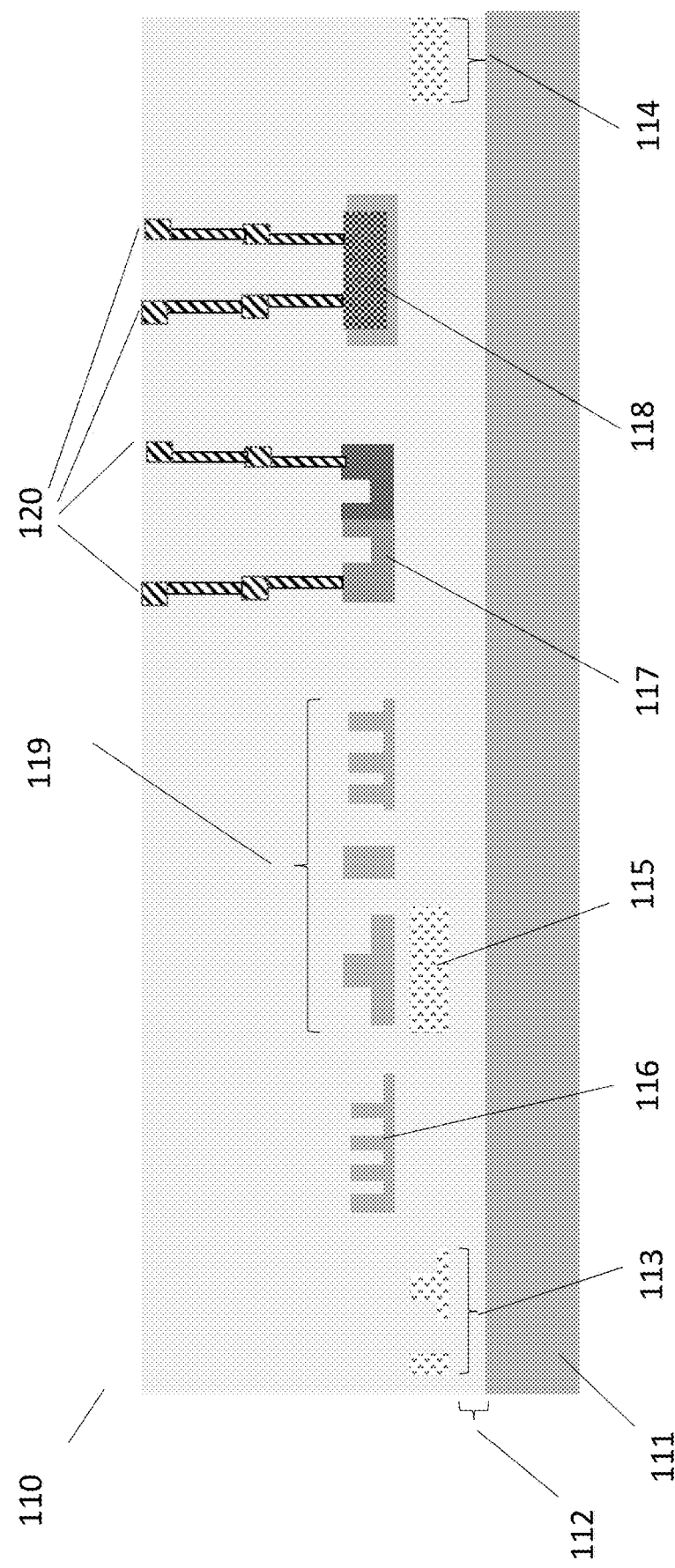
FIG. 1(b) an embodiment of the proposed moderate refractive index (contrast) material integrated below single crystalline Si layer with the photonic building blocks in it.

FIG. 1(b) shows the proposed wafer system 110 with moderate refractive index (contrast) material integrated below single crystalline Si layer. The system 110 starts with Si substrate 111, on which a layer of thermal oxide 112 with targeted thickness, which meets the requirement of optical designs, is grown. On top of oxide 112, a layer of moderate refractive index (contrast) material, in which various of photonic build blocks (or devices) are fabricated. They are photonic circuit 113, cross the lithography step field optical routing structure 114, coupling structure 115 for evanescence coupling and mode matching between the bottom photonic circuits in moderate refractive index (contrast) material and upper circuit in single crystal Si layer. Above the bottom layer of moderate refractive index (contrast) material, there is a bonded single crystal Si layer, in which various of photonic building blocks (devices) are built including but not limited to grating structure 116, modulator 117, Ge PD 118, various optical routing structures including those for between layer coupling 119, and vertical electrical connection paths 120 for active devices.

Figure 2:
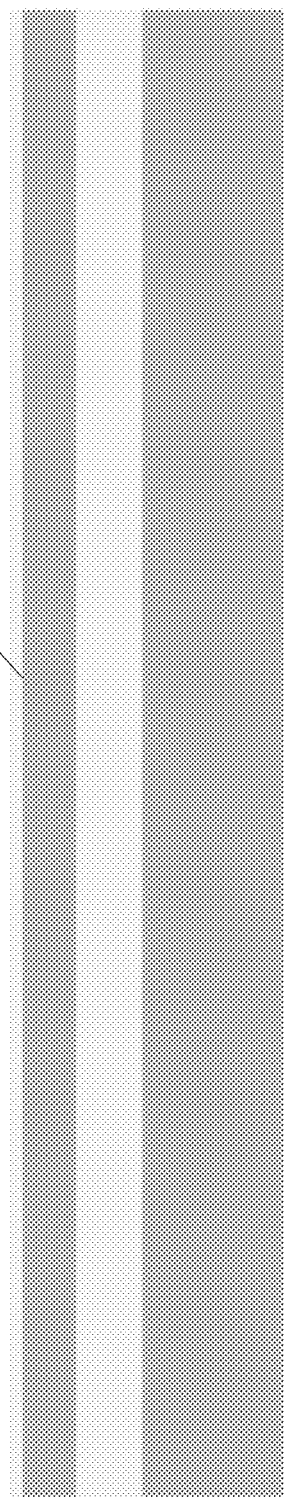
FIG. 2(a)-(f) an embodiment of a step-by-step process flow for the proposed moderate refractive index (contrast) materials integrated with a single crystal Si layer from a SOI wafer bonded on top.
FIG. 2(g) extra material chip bonded on top of patterned single crystal Si layer for a functional device.
FIG. 2(h)-(j) an embodiment of a process flow to bond extra material directly on top of the device in the layer of moderate refractive index (contrast) material using sacrificial features built in the Si layer.
FIG. 2(k)-(m) an embodiment of a process flow of making undercut structures below the passive or active devices in Si layer by introducing sacrificial features in the moderate refractive index material layer.
Figure 2:
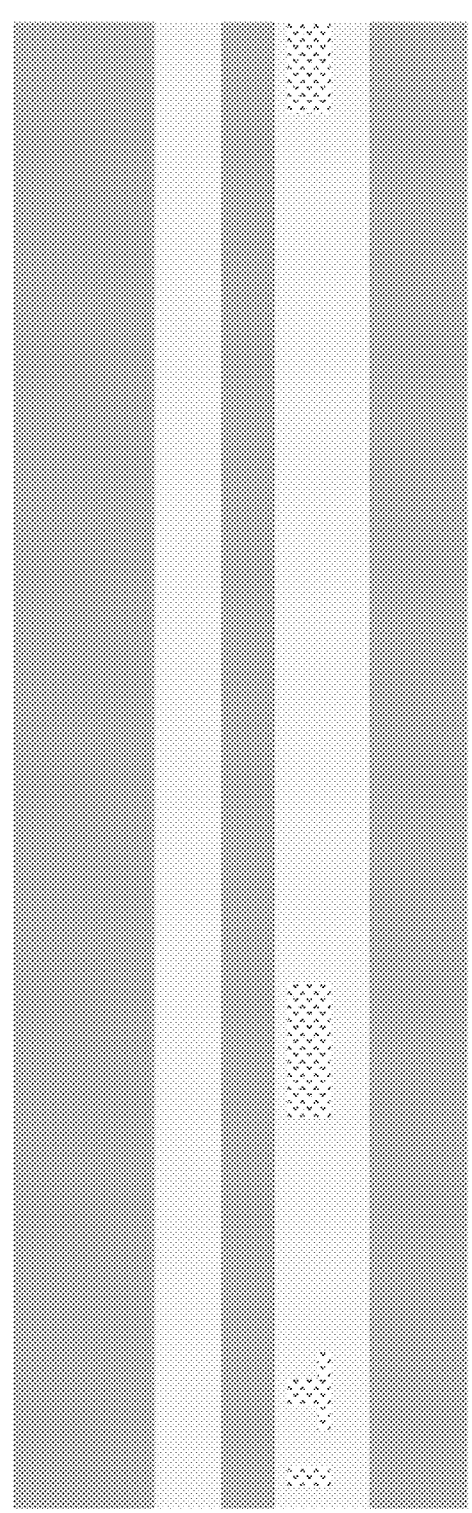
Figure 2:
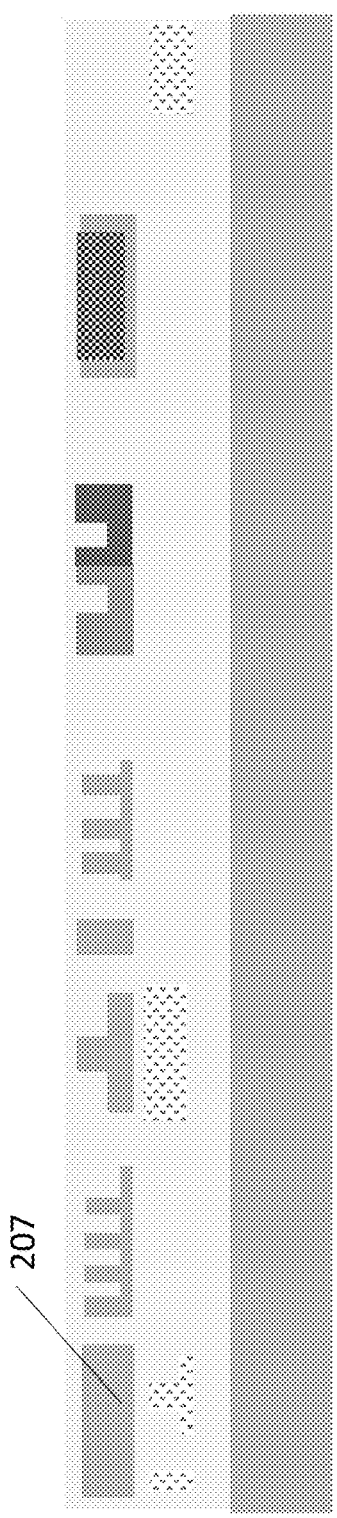
Figure 2:
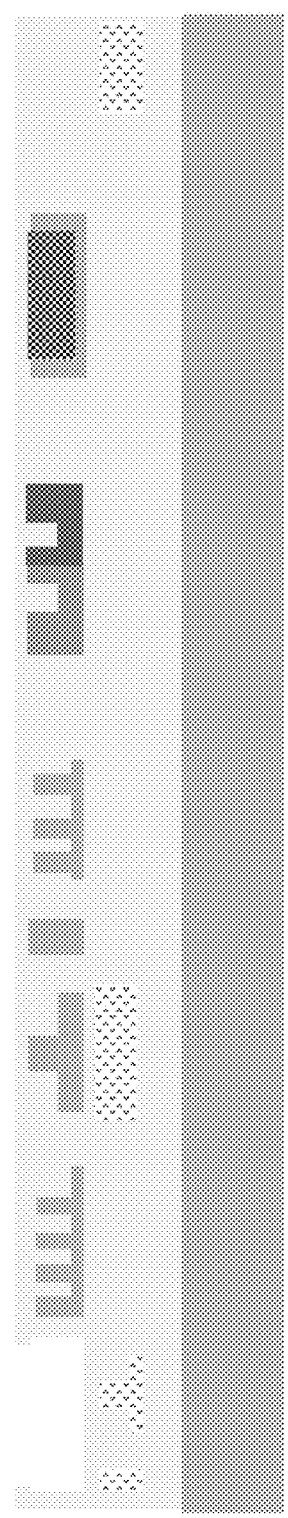
Figure 2:
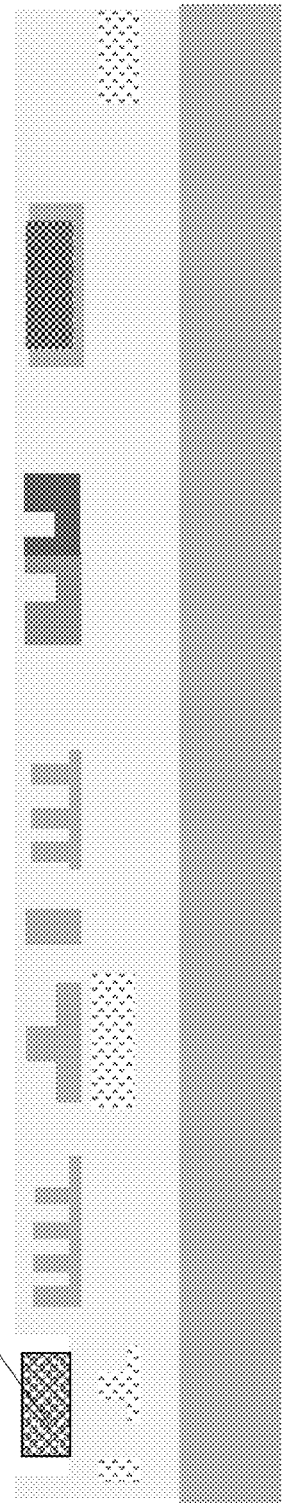
Figure 3A:
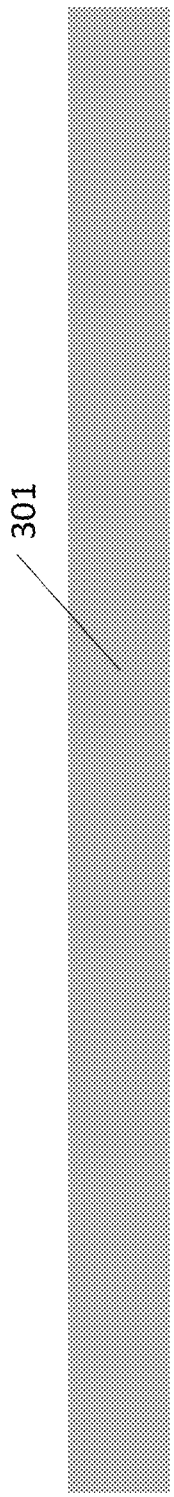
FIG. 3(a)-(f) an embodiment of a step-by-step process flow for the proposed moderate refractive index (contrast) materials integrated with a single crystal Si layer from an ion implanted Si wafer.
Figure 3B:
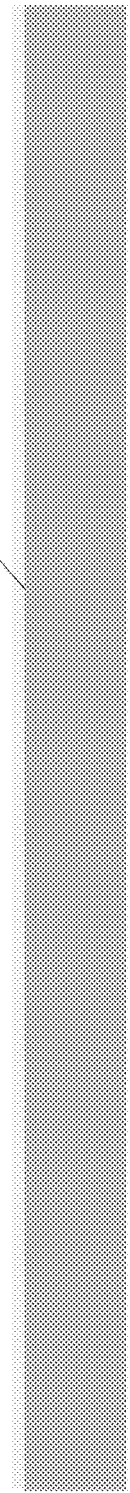
Figure 3C:
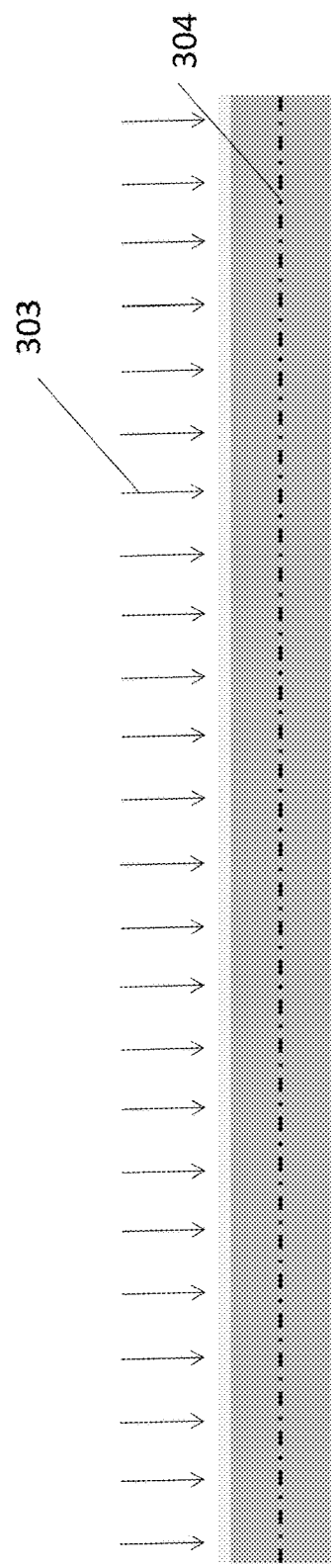
Figure 3D:
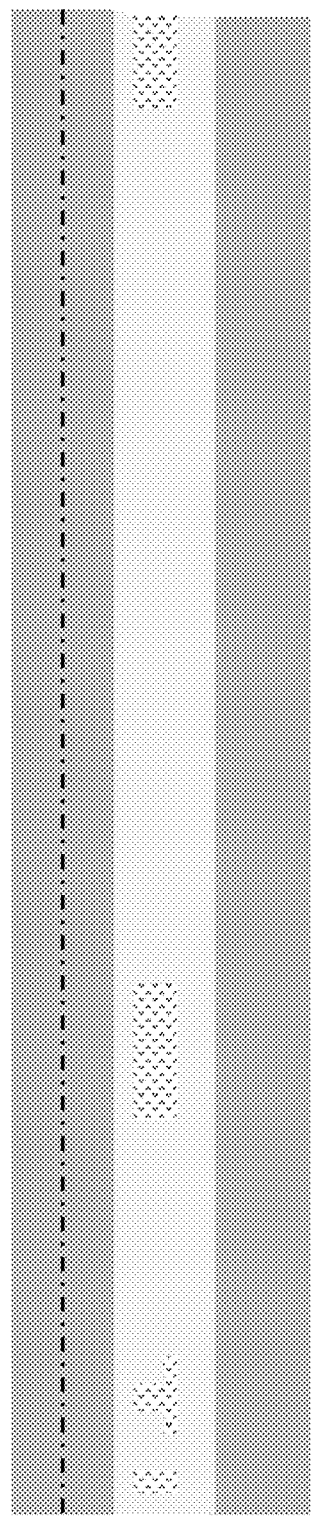
Figure 3E:
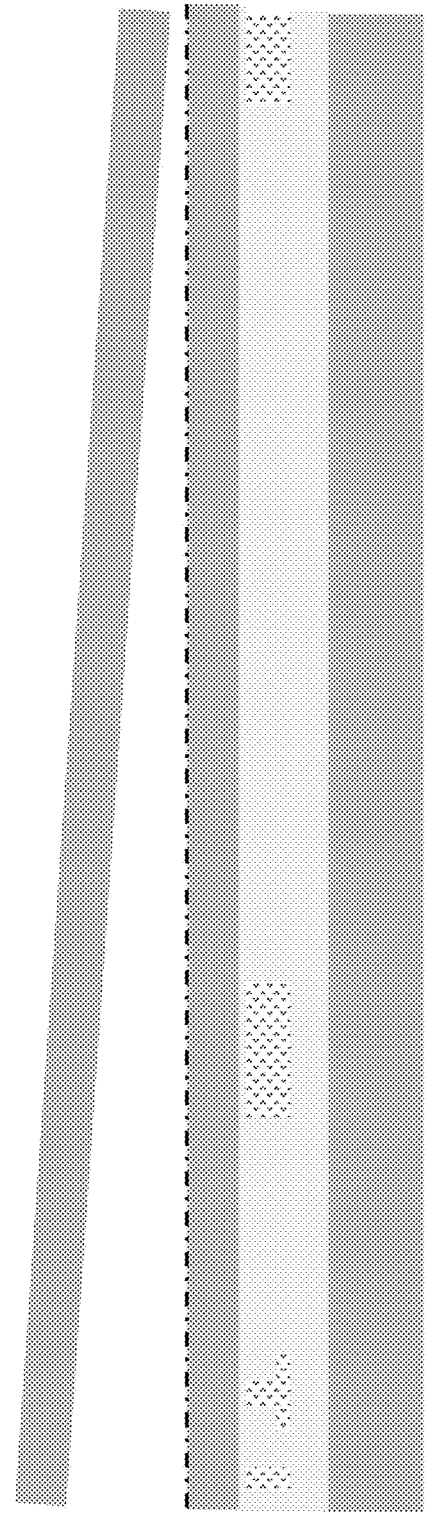
Figure 3F:
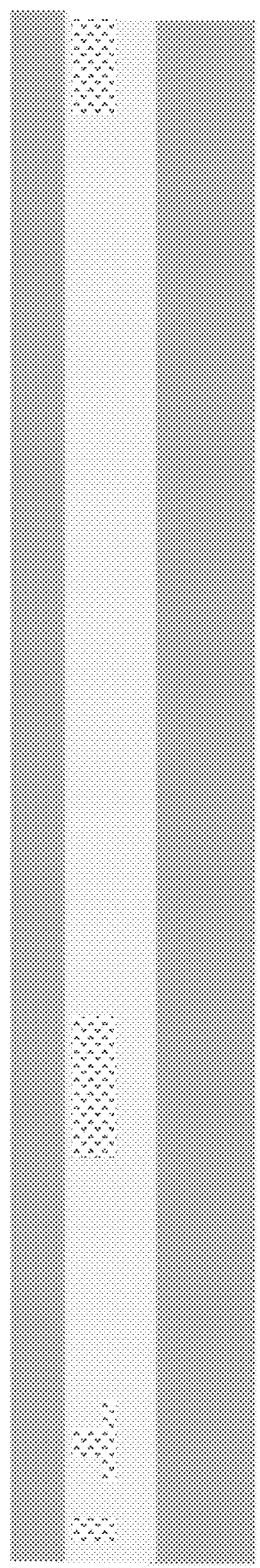
Figure 4A:
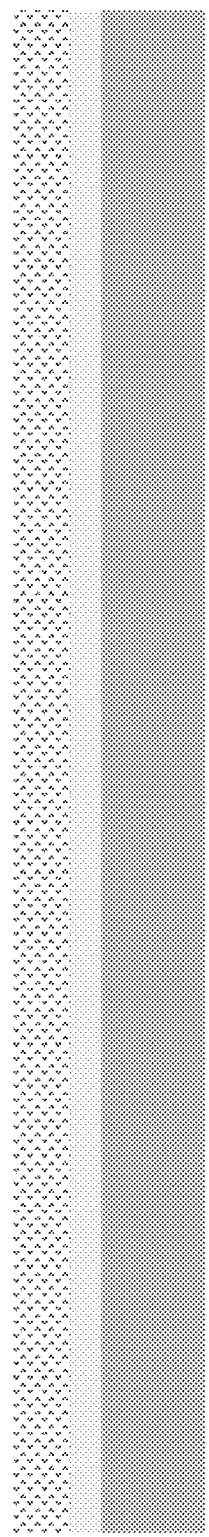
Figure 4B:
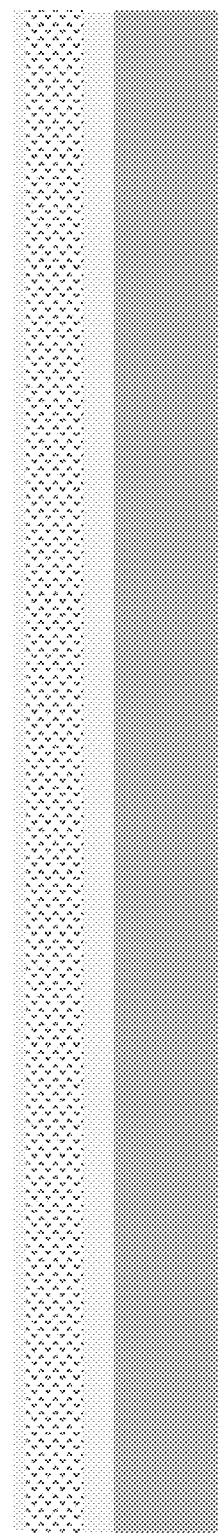
Figure 4E:
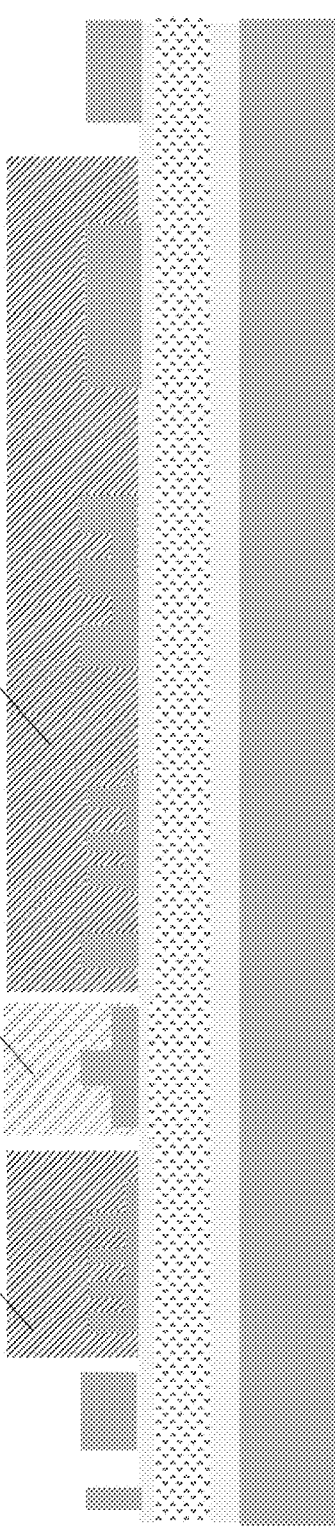
Figure 4F:
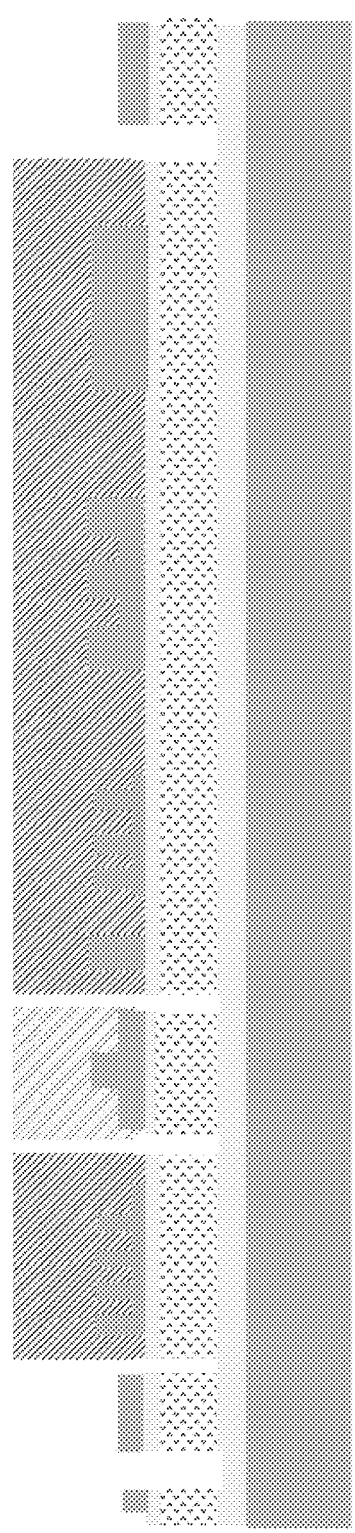
Figure 4G:
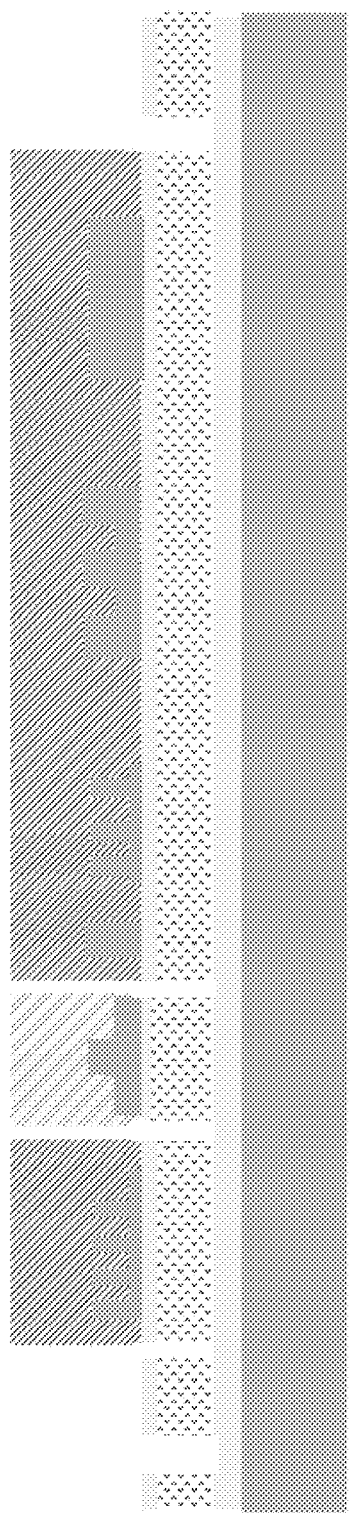
Figure 4H:
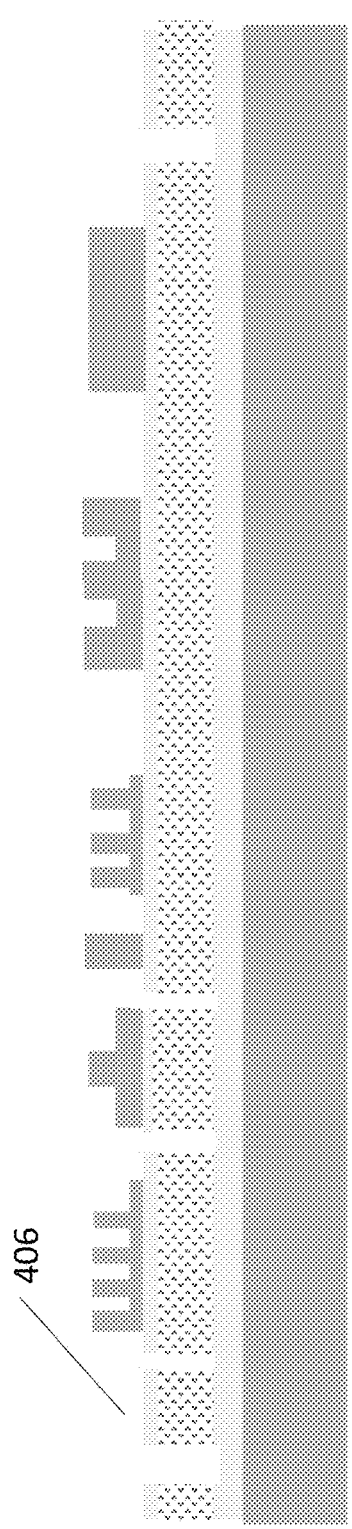
Figure 4I:
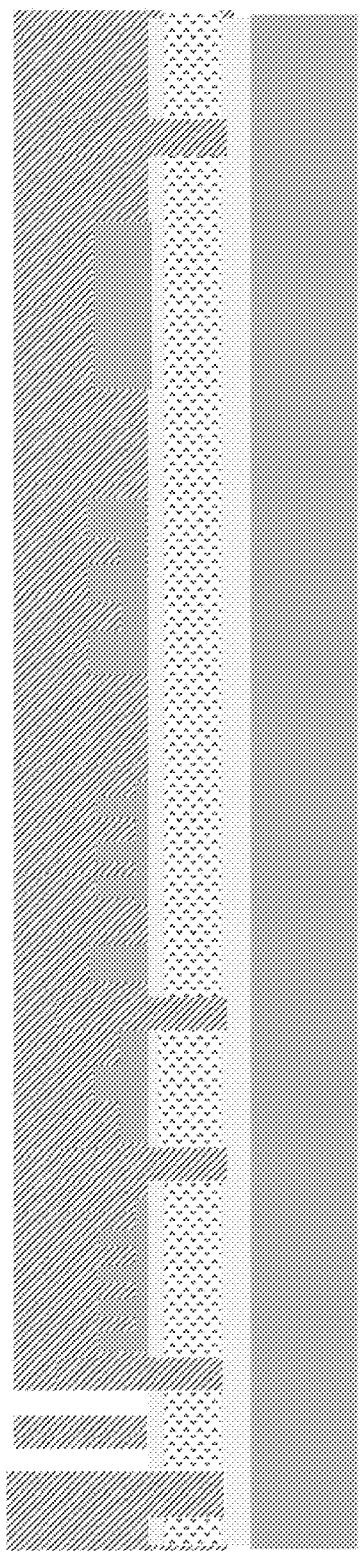
Figure 4J:
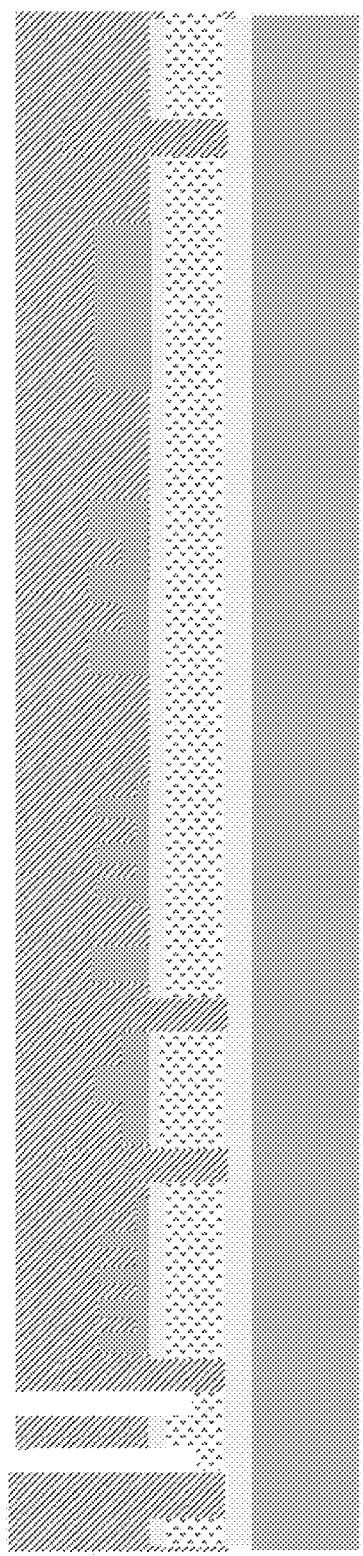
Figure 4K:
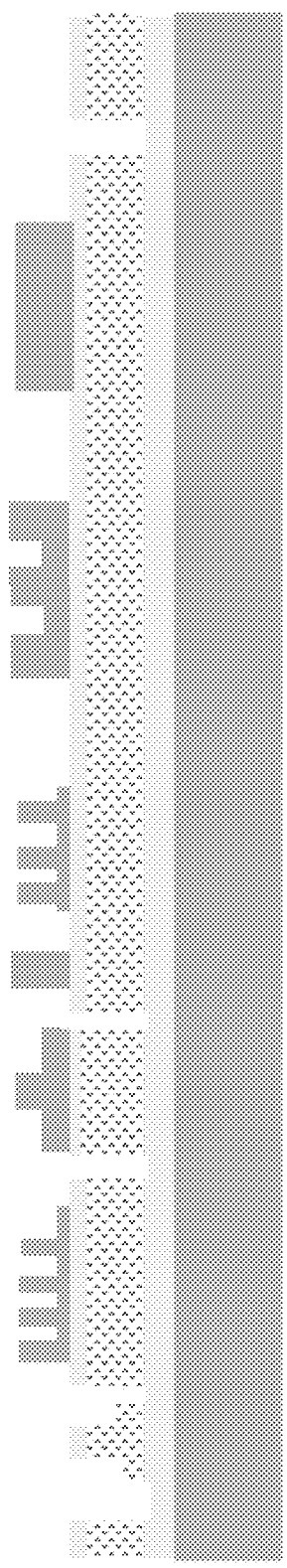
Figure 4L:
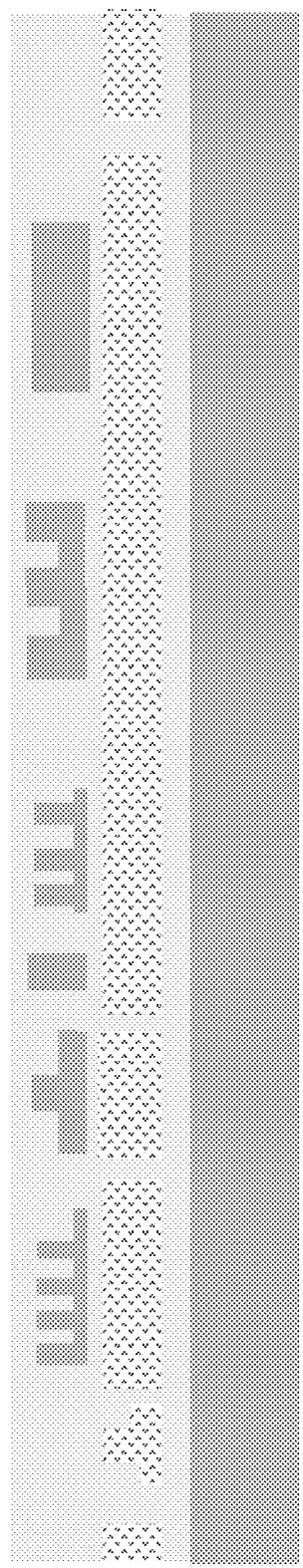

FIG. 2 shows an embodiment of a process flow for the proposed material platform to heterogeneously integrated moderate refractive index (contrast) material layer with device patterning, SiO2 backfill, then CMP before a bonded single crystal Si wafer from a SOI wafer is introduced on top. The process starts with incoming Si wafer 201, on which a layer for thermal silicon oxide 202 is grown with predetermined thickness as shown in FIG. 2(a). A layer of moderate refractive index (contrast) material with predetermined thickness 203 is deposited on top as shown in FIG. 2(b). Since there is no thermal budget limitation and no concerns of plasma damage for the layer below, the higher temperature process for the best material properties can be used to deposit the layer 203. For example, the stochiometric Si3N4 can be deposited via low pressure chemical vapor deposition (LPCVD) followed by high temperature (>1000 C) annealing to drive out N—H and Si—H bonds from the as-deposited layer 203. After the deposition, the photonic building blocks (or devices) is lithographically patterned, then pattern transfer into layer 203 by reactive ion etch (RIE) followed by backfill of SiO2 and CMP-ed to flatten the wafer surface with smooth surface quality ready for the incoming wafer-to-wafer bonding. During the layer 203's patterning, if needed, hard mask can be used and removed afterwards just like CMOS FEOL patterning.

FIG. 2(d) is a incoming SOI wafer from the SOI suppliers with a thin predetermined thermal oxide 204 grown on top. As shown in FIG. 2(e), the SOI wafer is then bonded on top of wafer already with the patterned moderate refractive index (contrast) layer 203 as shown in FIG.(c). The Si substrate (or carrier substrate) and BOX layer from the original SOI wafer are then removed. At the end, as shown in FIG. 2(f), a single crystal layer 205, which is the previous SOI layer, is left on wafer, whose carrier Si substrate is now 201. All the Silicon oxide below the layer 205 can be effectively treated as so-called BOX layer in a normal SOI wafer. Just as normal Si photonic process on virgin SOI wafer, all the photonic building blocks (or devices) can be made with in layer 205 as shown in FIG. 2(g). As such, there is no bonding alignment difficulty at all because the alignment assistant patterns in bottom layer 203 can be used during devices' (or build blocks') fabrication in layer 205. If needed, extra material chip 206 can be also bonded on top of layer 205 using collective chip-to-wafer bonding as shown in FIG. 2(g). The extra material can be III-V stack for light source, or detector, or modulator, or for semiconductor optical amplifier etc, while the coupling between devices in the layer 205 and devices in 206 is evanescence coupling while the bonding interface can be just simple SiO2-to-SiO2 or other dielectric to dielectric bonding interface.

FIG. 2(h) to FIG. 2(j) show a process flow to bond extra material directly on top of the device in the layer 203 of moderate refractive index (contrast) material. Comparing FIG. 2(g) and FIG. 2(h), apart from missing material die 206, FIG. 2(h) has extra patterned Si feature 207, which is a sacrificial structure. The surface of the wafer shown in FIG. 2(h) is planarized with all the building blocks (or devices) and features in layer 205 is covered by a thin SiO2. As shown in FIG. 2(i), the oxide above the sacrificial feature 207 is opened then followed by 207's removal, then a new material chip 208 can be bonded directly on top of the devices in layer 203 with evanescence coupling is needed. There are many choices of the materials and the devices made from different materials (or material stacks) by either collective chip-to-wafer bonding or transfer print. Device fabrication can be follow up if material 208 is only material or material stack rather than function device. The advantage of the doing device fabrication after bonding is that it mitigates the alignment challenge during collective die-to-wafer bonding.

FIG. 2(k) to FIG. 2(m) show a process flow of making some undercut structures below the passive or active devices to boost their performance. In this particular example, a modulator structure 209 in the single crystal Si layer 205 is used as an example. Compared with what has been shown in FIG. 2(*h*), in FIG. 2(*k*), below the device 209 in the single crystal Si layer, there is a sacrificial feature 210 in the bottom layer made with moderate refractive index (contrast) material. As shown in FIG. 2(*l*), in the SiO2 cladding layer, there are purposely created etch paths 211, from which the sacrificial feature of 212 can be removed either by RIE, vapour etch, or wet etch. This will leave a undercut structure as show in FIG. 2(*mm*) below the targeted device 209. The void can be sealed and flatten by subsequent SiO2 backfill and CMP.

FIG. 3 shows an embodiment of process flow for the proposed moderate refractive index (contrast) materials integrated with a single crystal Si layer from an ion implanted Si wafer. The preparation of the bottom part of the wafer with the fabricated building blocks (or devices) in the moderate refractive index (contrast) material layer is essentially the same as what have been shown from FIG. 2(*a*) to FIG. 2(*c*), which will not be repeated again. The description of the following process is very much similar to so-called wafer smart cut processes. For the incoming single crystal Si layer bonded on top of the moderate refractive index (contrast) material layer, as shown in FIG. 3(*a*), the incoming substrate is a single crystalline wafer 301, on which a thermal oxide SiO2 302 is grown shown in FIG. 3(*b*). As shown in FIG. 3(*c*), the wafer is then subject to ion implantation to created a highly stressed layer 304 with the densest implanted ion concentration. As shown in FIG. 3(*d*), the ion implanted wafer is then up-side-down bonded on top of the bottom portion of the wafer shown in FIG. 2(*c*). Under certain heat treatment or annealing, the substrate will be split from substrate as shown in FIG. 3(*e*). After a light polishing (CMP), the finished wafer will have the single crystal Si layer over the moderate refractive index (contrast) material layer as shown in FIG. 3(*f*), from which the subsequent processes can be carried out for device fabrication within the bonded layer.

FIG. 4 shows a schematic embodiment of process flow to generate photonic circuitry in both single crystalline Si layer and the moderate refractive index material layer without patterning the moderate refractive index material layer before the single crystal Si layer bonded on. One of the biggest advantage on the process side is to reduce the planarization (or CMP) process requirement if the patterned of the moderate refractive index material layer before bonding. Like the process flow shown from FIG. 2(*a*) to FIG. 2(*b*), the moderate refractive index (contrast) material layer is now on the wafer as shown in FIG. 4*a*, As shown in FIG. 4(*b*), a high quality SiO2 is then deposited cross the wafer. Without patterning the moderate refractive index (contrast) material, as shown in FIG. 4(*c*) a single crystal Si layer is bonded on top of the wafer as previously shown either from a SOI wafer (FIG. 2(*d*)-FIG. 2(*f*)) or from an ion implanted single crystal wafer (FIG. 3(*a*)-FIG. 3(*f*)). Without prepatterning of the moderate refractive index (contrast) material layer makes the single crystal Si bonding relatively easier. On the other hand, without the patterning, the moderate refractive index (contrast) material layer, which is left below some building blocks (device) and structures created in the Si layer, will act partially as bottom cladding materials. As such, it is undoubted that the detailed designs of the build blocks/devices in the Si layer need to be adjusted. Nevertheless, considering the well controlled deposition with stoichiometry is used for the moderate refractive index (contrast) material, its properties should also be well understood. Therefore it should be relatively easier to adjust various designs based on optical device modelling results.

The device patterning is carried out in the bonded single crystal layer as shown in FIG. 4(*d*) (note: for the simplicity of schematic drawing, the hard mask during the Si layer patterning is not shown here. Nevertheless, it should be there for the later wafer planarization purpose), Compared with FIG. 2(*g*), apart from absence of the feature 206, there are several extra features, such as 401, 402, 403, present in FIG. 4(*d*), which will be used as hard mask for the incoming pattern transfer into the moderate refractive index (contrast) material layer below. As shown in FIG. 4(*e*), photoresist protection 404, 405 is implemented on top of the building blocks (or devices), which would like to be preserved, while there is no photoresist protection layer on top for those features need to transfer to the moderate refractive index (contrast) material layer below. It is noticeable that the photoresist protection 405 on top of the layer-coupling structure is different from the rest of the building blocks (or devices). This is because that there is a transition happening along the direction perpendicular to the paper in this particularly drawing. We will discuss more in the following section in FIG. 5. As shown in FIG. 4(*f*), after RIE, the top pattern is successfully transfer into the bottom moderate refractive index (contrast) material layer. Then, as shown in FIG. 4(*e*), the remaining Si is removal in original place marked as 401, 402, 403. The protection photoresist 404, 405 is then removed as shown in FIG. 4(*h*). For some devices such as those shown as 406 in FIG. 4(*h*) in the moderate refractive index (contrast) material layer, extra patterning is needed. Considering devices in the moderate refractive index (contrast) material layer have much larger dimensions compared with those existing in Si layer, thicker photoresist can be used here as shown in FIG. 4(*i*), followed by pattern transfer into the moderate refractive index (contrast) material layer below as shown in FIG. 4(*j*). The resist can then be removed as shown in FIG. 4(*k*) followed by SiO2 backfill and CPM (as mentioned previously the hard mask used during the bonded Si patterning is very important here for CMP control).

Figure 6:
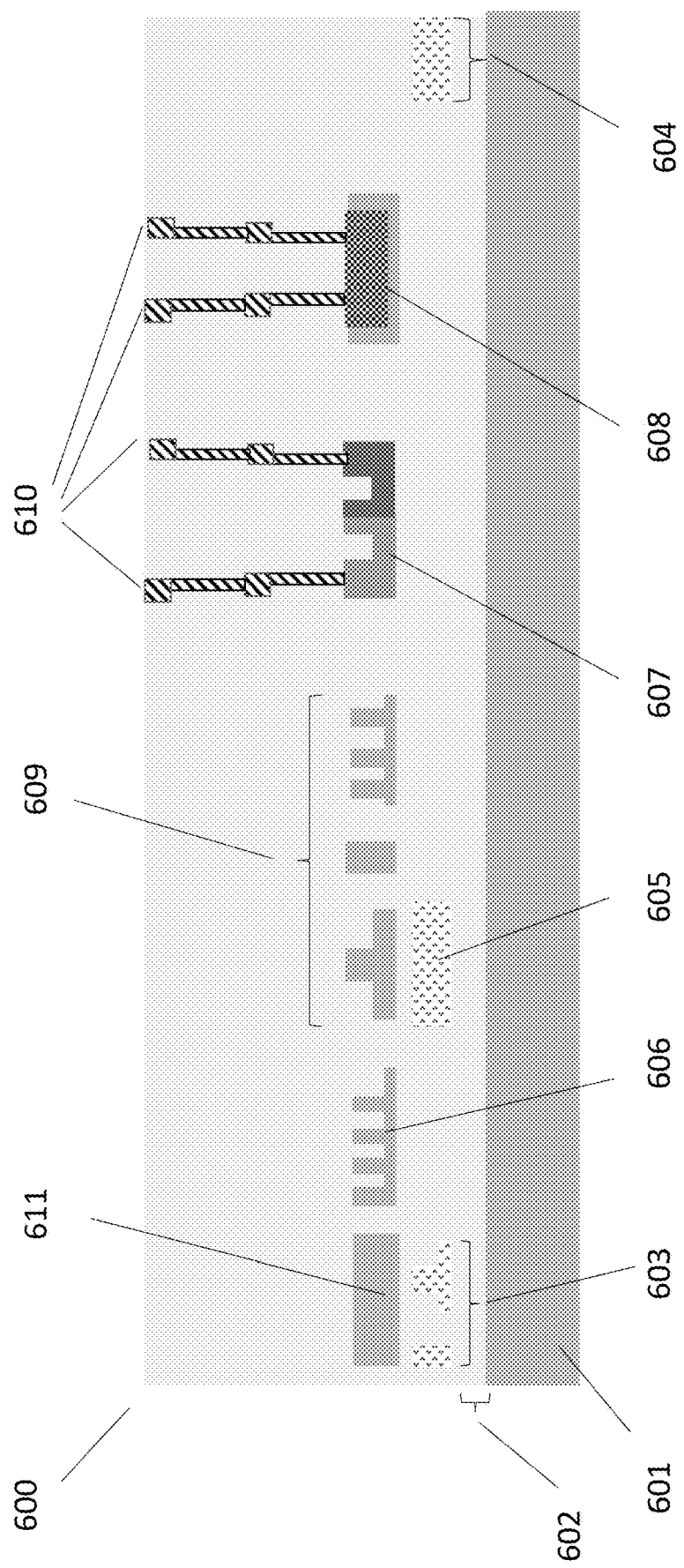
FIGS. 6(a) and (b) an embodiment of a process flow for the proposed material platform used for optical sensor applications with the removal of sacrificial features in Si layer to expose the waveguide structure in moderate refractive index (contrast) material layer.
Figure 6:
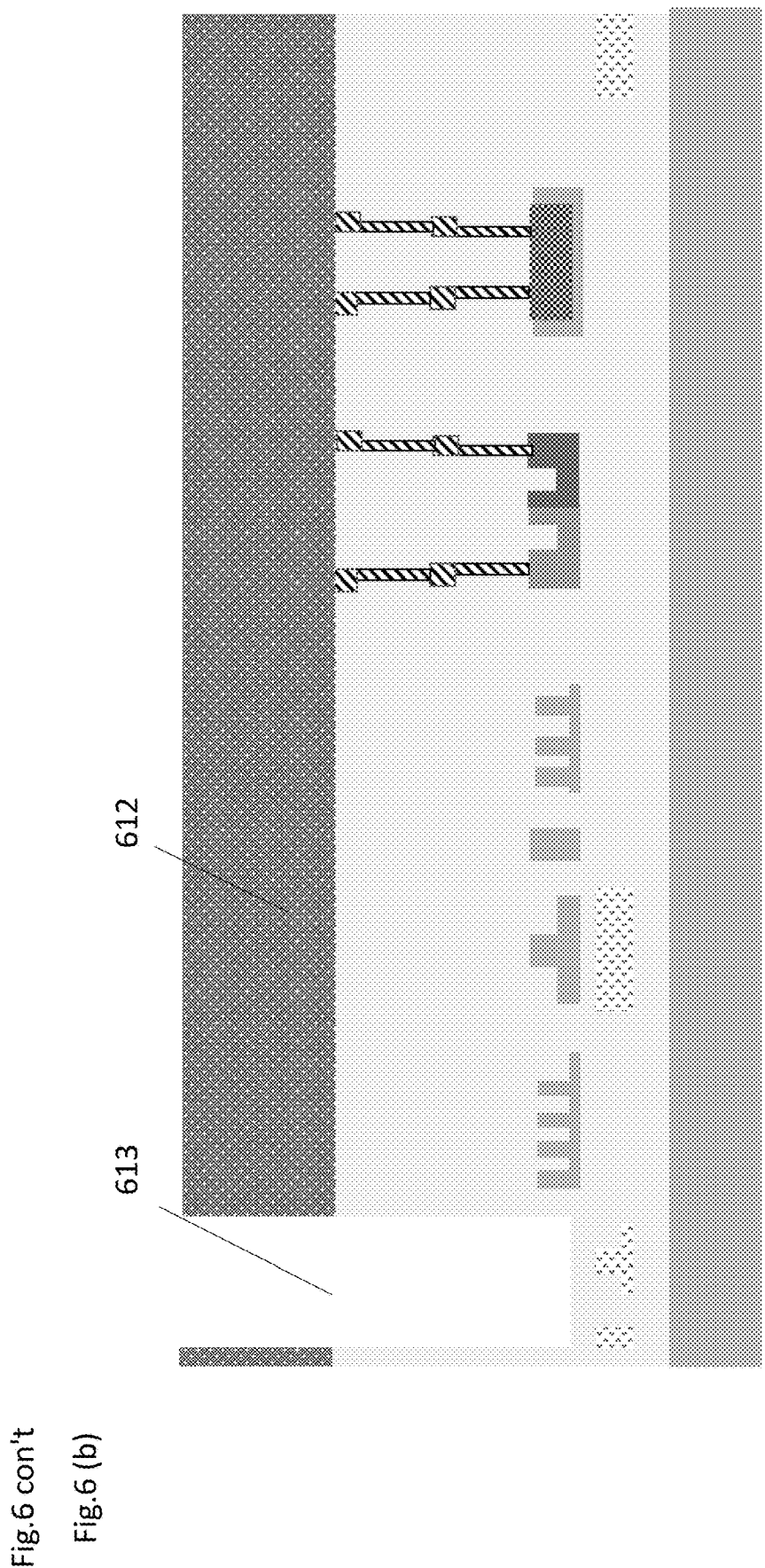

FIG. 5(*a*) shows the projection view of the optical coupling structure, inside the paper for those shown as 405 in FIG. 4(*d*), a optical device for light coupling between a building block in the bottom moderate refractive index (contrast) material layer and a device in the top bonded single crystal Si layer for the process steps described in FIG. 4(*d*) to FIG. 4(*f*). After process shown in FIG. 4(*d*) is done, ie. all the devices' patterns (or shapes) in top bonded single crystal Si layer has been created, the projection view of the bottom layer and the top layer transition area looks as what is being shown in FIG. 5(*a*). On top of the SiO2 layer 501, which separates the bottom layer from the top layer, the patterned structure 502 is created in the top Si layer. The cross section A-A cut and B-B cut are shown on the right hand side in FIG. 5(*a*) labeled as FIG. 5(*b*) and FIG. 5(*c*) respectively. Along the arrow 503 is the structure, which need to pattern transfer to the bottom layer as part of the coupling structure linking the bottom layer to the top layer, while the arrow 504 indicates the direction to the waveguide structure in the top Si layer, which is needed to be preserved in the subsequent process steps. FIG. 5(*d*) shows the top down view of the photoresist 505 protecting on the pattern structures in the top layer while leaving the structures on the left open during the pattern-transfer RIE process (as previously shown in FIG. 4(*f*)). Their cross sections patterns at both A-A and B-B cuts are also shown on the right hand side of FIG. 5(*d*) labeled as FIG. 5(*e*) and FIG. 5(*f*) respectively. After the top feature 506 in the top Si layer is removed and subsequent the process steps described from FIG. 4(*g*) to FIG. 4(l) are done, the light can travel from bottom layer to top layer and vice versa through such or similar structures via evanescence coupling, FIG. 6 shows an embodiment of the proposed material platform used for sensor applications via evanescence wave leaking from the waveguide built in the moderate refractive index (contrast) material layer, which has less light confinement. To enable sensor application, the thick dielectric above the bottom moderate refractive index (contrast) material layer need be mostly remove with only a thin SiO2 left over the device designed to interact with either gas, or liquid, or both in the surround environment. In the proposed platform for sensor application 600, for the purpose of process illustration, it is assumed here that all the features shown in FIG. 6(a) are identical to those shown in FIG. 1(b). They are Si substrate 601, on which a layer of thermal oxide 602. On top of oxide 602, a layer of moderate refractive index (contrast) material, in which various of photonic build blocks (or devices) are fabricated. They includes photonic circuit 603, cross the lithography step field optical routing structure 604, coupling structure 605 for evanescence coupling and mode matching between the bottom circuit in moderate refractive index (contrast) material and upper circuit in single crystal Si layer. Above the bottom layer of moderate refractive index (contrast) material, there is a bonded single crystal Si layer, in which various of photonic building blocks (devices) are built including but not limited to grating structure 606, modulator 607, Ge PD 608, various optical routing structures including those for between layer coupling 609, and vertical electrical connection paths 610 for active devices. Nevertheless, in the bonded single crystal Si layer, there is one unique feature 611, which is a sacrificial dielectric RIE stop layer. As shown in FIG. 6(b), to remove most dielectric materials on top of the structure 603, a thick photoresist 612 is coated and pattern with the open 613 to allow RIE to etch away the most dielectric layer and stop within the feature 611, which can then be removed by isotropic RIE process. At the end, only a SiO2 layer thinner than the one separating the bottom moderate refractive index (contrast) material layer and top bonded Si layer is left on top of the structure 603, whose evanescence wave can interact with outside environment. After the photoresist 612 is removed, the chip can be used for sensing applications.

What is claimed is:

1. A photonic integrated circuit device on a single wafer substrate comprising:
   a light circuit composed of a set of optical devices in a layer of a moderate refractive index material made of a tri-layer of A/SiO$_2$/B, wherein A is a material of a top layer with a thickness $t_1$,
   wherein the SiO$_2$ layer is the middle layer and has a thickness $t_2$, which is thinner than half of a predetermined wavelength, wherein B is a material of a bottom layer with a thickness $t_3$,
   wherein materials A and B comprise Si$_3$N$_4$, or SiON, or AlN, or diamond, LiNbO$_3$, or SiC, or Ta$_2$O$_5$, or TiO$_2$, or As$_2$S$_3$, or high index doped SiO$_2$,
   wherein the top layer of material A is deposited first on the top surface of the single wafer substrate;
      an optical circuitry composed of a set of devices in a single crystal Si layer, which is transferred on top the single wafer substrate via a wafer-to-wafer bonding process, wherein the optical circuitry in the single crystal Si layer is located above the layer of moderate refractive index material; and
      alight coupling structure to allow light traveling between the optical devices of the light circuit in the layer of moderate refractive index material and the set of devices of the optical circuitry in the single crystal Si layer.

2. The device of claim 1, wherein said moderate refractive index material has its refractive index value smaller than that of said single crystal Si layer with a minimal predetermined number in full optical spectrum.

3. The device of claim 1, wherein said wafer, from which said single crystal Si layer is obtained, is a silicon-on-insulator (SOI) wafer.

4. The device of claim 1, wherein said wafer, from which said single crystal Si layer is obtained, is a single crystal Si wafer with ion implantation ready for ion cut after said wafer-to-wafer bonding process.

5. The device of claim 1, wherein said set of optical building blocks said layer of a moderate refractive index material includes at least a device cross a lithography step field to extend the size of said photonic integrated circuitry beyond the size of a lithography step field(s) with minimal optical impact from any stitching error between the lithography step fields.

6. The device of claim 1, wherein said set of devices in said single crystal Si layer has at least a sacrificial dummy feature, which will be removed to leave a space for a bonded functional material chip, which is coupled with said light circuit in said layer of a moderate refractive index material via an optical evanescence wave.

7. The device of claim 1, wherein said set of optical building blocks in said layer of a moderate refractive index material has at least a sacrificial dummy feature, which will be removed to leave a undercut below a function device in the top Si layer to enhance its performance.

8. The device of the claim 1, wherein said set of devices in said single crystal Si layer has at least a sacrificial dummy feature above an optical building block in said layer of a moderate refractive index material.

9. The device of the claim 8, wherein said sacrificial dummy feature is used as a RIE stop layer during a RIE process to remove all the dielectric materials above the dummy feature.

10. The device of the claim 8, wherein said sacrificial dummy feature is removed by isotropic RIE process, after all the dielectric materials above have been removed, and leave only a thin layer of SiO$_2$ over said optical building block in the bottom layer.

11. The device of the claim 10, wherein said thin layer of SiO2 allows the light passing through said optical building block in the layer of a moderate refractive index material to leak out as an evanescence wave, which interacts with surrounding environment to allow an optical sensing.

12. The system of the claim 1, wherein said tri-layer of A/SiO$_2$/B has said top layer made of material A being the same as said bottom layer made of material B.

* * * * *